US012598694B2

(12) United States Patent
    Lee

(10) Patent No.: US 12,598,694 B2
(45) Date of Patent: Apr. 7, 2026

(54) CIRCUIT BOARD AND ELECTRONIC ASSEMBLY

(71) Applicant: VIA LABS, INC., New Taipei City (TW)

(72) Inventor: Sheng-Yuan Lee, New Taipei City (TW)

(73) Assignee: VIA LABS, INC., New Taipei City (TW)

( * ) Notice: Subject to any disclaimer, the term of this patent is extended or adjusted under 35 U.S.C. 154(b) by 222 days.

(21) Appl. No.: 18/649,994

(22) Filed: Apr. 29, 2024

(65) Prior Publication Data

US 2025/0267785 A1     Aug. 21, 2025

(30) Foreign Application Priority Data

Feb. 17, 2024    (TW) ................................. 113105670

(51) Int. Cl.
    H05K 1/02          (2006.01)
    H05K 1/181         (2026.01)

(52) U.S. Cl.
    CPC ......... H05K 1/0224 (2013.01); H05K 1/0265 (2013.01); H05K 1/181 (2013.01); H05K 2201/09309 (2013.01); H05K 2201/10734 (2013.01)

(58) Field of Classification Search
    CPC .................................................... H05K 1/0265
    USPC ........................................................ 361/760
    See application file for complete search history.

(56) References Cited

U.S. PATENT DOCUMENTS

| 7,639,510 B2 * | 12/2009 | Fritz ..................... | H04Q 1/116 |
| | | | 361/780 |
| 11,439,002 B2 * | 9/2022 | Yu ........................ | H05K 1/0265 |
| 2004/0228100 A1 * | 11/2004 | Wright ................. | H05K 1/0224 |
| | | | 361/794 |
| 2005/0133257 A1 * | 6/2005 | Lauffer ................ | H05K 1/0228 |
| | | | 174/262 |
| 2007/0068699 A1 * | 3/2007 | Lentschke ............ | H05K 1/0231 |
| | | | 174/255 |
| 2024/0422895 A1 * | 12/2024 | Harrigan .............. | H05K 1/0298 |

* cited by examiner

*Primary Examiner* — Stanley Tso
(74) *Attorney, Agent, or Firm* — JCIPRNET

(57)          ABSTRACT

A circuit board is suitable for mounting an electronic package. The circuit board includes a power layer and a circuit board surface which includes a package region corresponding to the electronic package. The package region is rectangular and includes four sides. The power layer includes a first power plane, a second power plane, a third power plane, and the forth power plane. An orthographic projection of the second power plane on the circuit board surface extends from outside into the package region and extending through at least three of the sides. An area of the orthogonal projection of the second power plane on the circuit board surface in the package region is greater than areas of the orthogonal projections of the other power planes on the circuit board surface in the package region. In addition, an electronic assembly including the circuit board and the electronic package is also provided.

27 Claims, 6 Drawing Sheets

1

CIRCUIT BOARD AND ELECTRONIC ASSEMBLY

CROSS-REFERENCE TO RELATED APPLICATION

This application claims the priority benefit of Taiwan application serial no. 113105670, filed on Feb. 17, 2024. The entirety of the above-mentioned patent application is hereby incorporated by reference herein and made a part of this specification.

BACKGROUND

Technical Field

The disclosure relates to a circuit board, and more particularly, to an electronic assembly having the circuit board.

Description of Related Art

A high-speed integrated circuit chip has multiple devices, therefore it requires multiple power planes. For example, a universal serial bus 4.0 Ver2.0 (USB 4.0 Gen4) requires four power planes to provide different voltages. However, when the same power plane is connected to multiple different circuit blocks, it is easy to cause crosstalk between signals. In addition, due to a limitation of the size of a package structure and high power of the high-speed integrated circuit chip, it is easy for a circuit board to overheat due to excessive resistance.

SUMMARY

The disclosure provides a circuit board, which may reduce signal crosstalk and an issue of overheating of the circuit board.

The disclosure provides an electronic assembly, which may reduce the signal crosstalk and the issue of overheating of the circuit board.

A circuit board in an embodiment of the disclosure is suitable for mounting an electronic package. The circuit board has a circuit board surface. The circuit board surface has a package region corresponding to the electronic package. The package region is rectangular and has four sides. The circuit board includes a power layer. The power layer includes a first power plane, a second power plane, a third power plane, and a fourth power plane. An orthographic projection of the first power plane on the circuit board surface extends from an outside of the package region into the package region and extends through at least one of these sides. An orthographic projection of the second power plane on the circuit board surface extends from the outside of the package region into the package region and extends through at least three of these sides. An orthographic projection of the third power plane on the circuit board surface extends from the outside of the package region into the package region and extends through at least one of these sides. An orthographic projection of the fourth power plane on the circuit board surface extends from the outside of the package region into the package region and extends through at least one of these sides. An area of the orthographic projection of the second power plane on the circuit board surface in the package region is greater than an area of the orthographic projections of each of the first power plane, the third power plane, and the fourth power plane on the circuit board surface in the package region. At least one of these sides through which the orthographic projection of the first power plane on the circuit board surface extends is the same as one of these sides through which the orthographic projection of the third power plane on the circuit board surface extends and at least one of the sides through which the orthographic projection of the first power plane on the circuit board surface extends is the same as one of these sides through which the orthographic projection of the fourth power plane on the circuit board surface extends.

An electronic assembly in an embodiment of the disclosure includes an electronic package and a circuit board. The circuit board is suitable for mounting the electronic package. The circuit board has a circuit board surface. The circuit board surface has a package region corresponding to the electronic package. The package region is rectangular and has four sides. The circuit board includes a power layer. The power layer includes a first power plane, a second power plane, a third power plane, and a fourth power plane. An orthographic projection of the first power plane on the circuit board surface extends from an outside of the package region into the package region and extends through at least one of these sides. An orthographic projection of the second power plane on the circuit board surface extends from the outside of the package region into the package region and extends through at least three of these sides. An orthographic projection of the third power plane on the circuit board surface extends from the outside of the package region into the package region and extends through at least one of these sides. An orthographic projection of the fourth power plane on the circuit board surface extends from the outside of the package region into the package region and extends through at least one of these sides. An area of the orthographic projection of the second power plane on the circuit board surface in the package region is greater than an area of the orthographic projections of each of the first power plane, the third power plane, and the fourth power plane on the circuit board surface in the package region. At least one of the sides through which the orthographic projection of the first power plane on the circuit board surface extends is the same as one of these sides through which the orthographic projection of the third power plane on the circuit board surface extends and at least one of the sides through which the orthographic projection of the first power plane on the circuit board surface extends is the same as one of these sides through which the orthographic projection of the fourth power plane on the circuit board surface extends.

Based on the above, in the above embodiment of the disclosure, four power planes are disposed on the power layer of the circuit board, which may provide multiple different voltages to a device in the electronic package. In addition, the design of the multiple power planes in the disclosure may reduce the resistance of the circuit board to reduce the issue of overheating of the circuit board.

DETAILED DESCRIPTION OF DISCLOSED EMBODIMENTS

Figure 1:
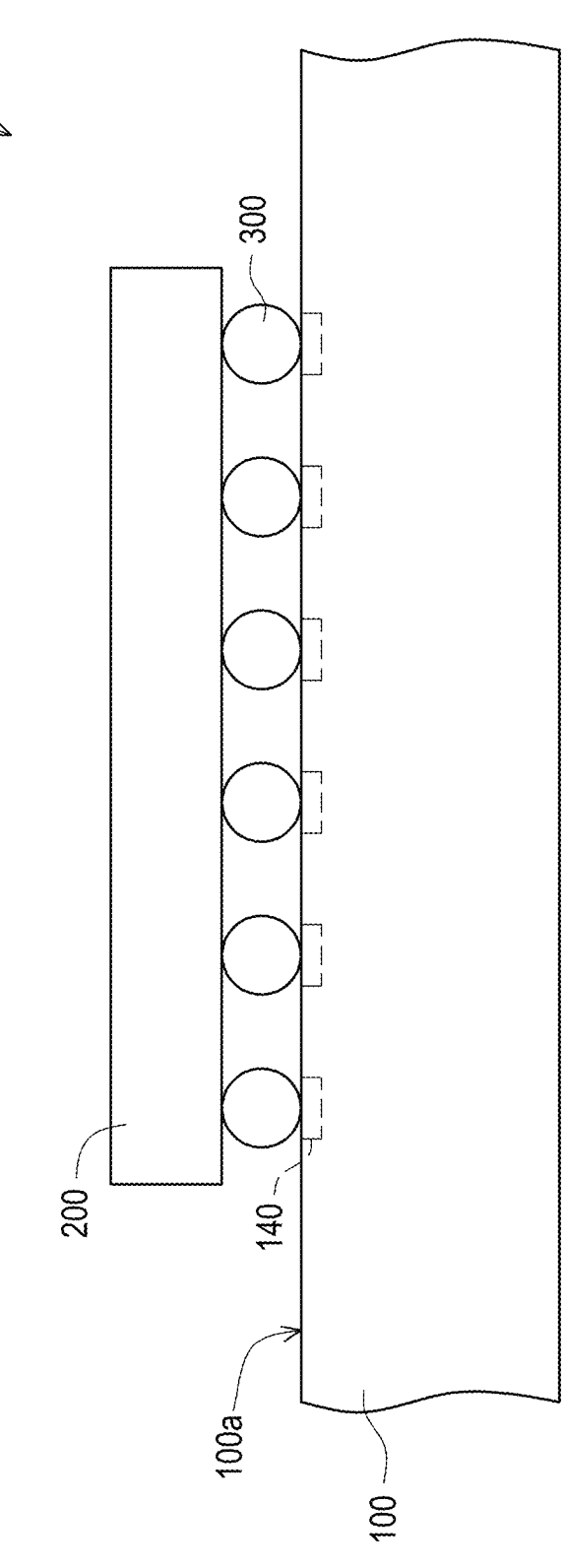
FIG. 1 is a schematic side view of an electronic assembly according to an embodiment of the disclosure.

Referring to FIG. 1, in this embodiment, an electronic assembly 10 includes a circuit board 100, an electronic package 200, and multiple conductive balls 300. The electronic package 200 is mounted on the circuit board 100 in a form of a ball grid array (BGA). Specifically, the circuit board 100 has a circuit board surface 100a, and the circuit board surface 100a may have multiple pads 140. The electronic package 200 may be electrically connected to the pads 140 of the circuit board 100 respectively by using the conductive balls 300. In this embodiment, the circuit board 100 is, for example, a circuit board of a high-speed SerDes (serializer/deserializer) integrated circuit chip, which may be used for devices of USB3.0, USB 4.0, PCIE, and DP (display port).

Figure 2A:
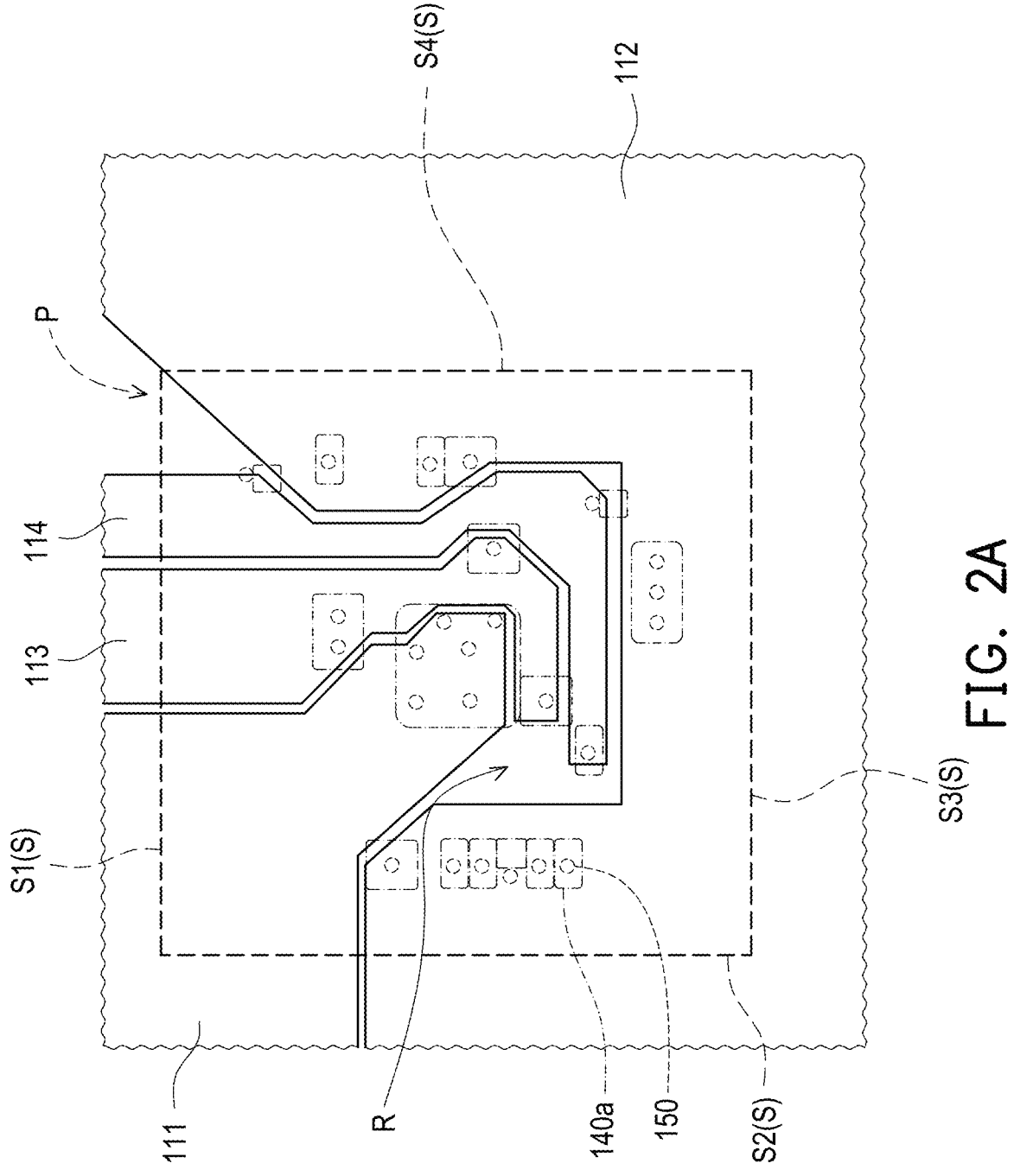
FIG. 2A is a schematic view of a package region of a circuit board according to an embodiment of the disclosure.
Figure 3:
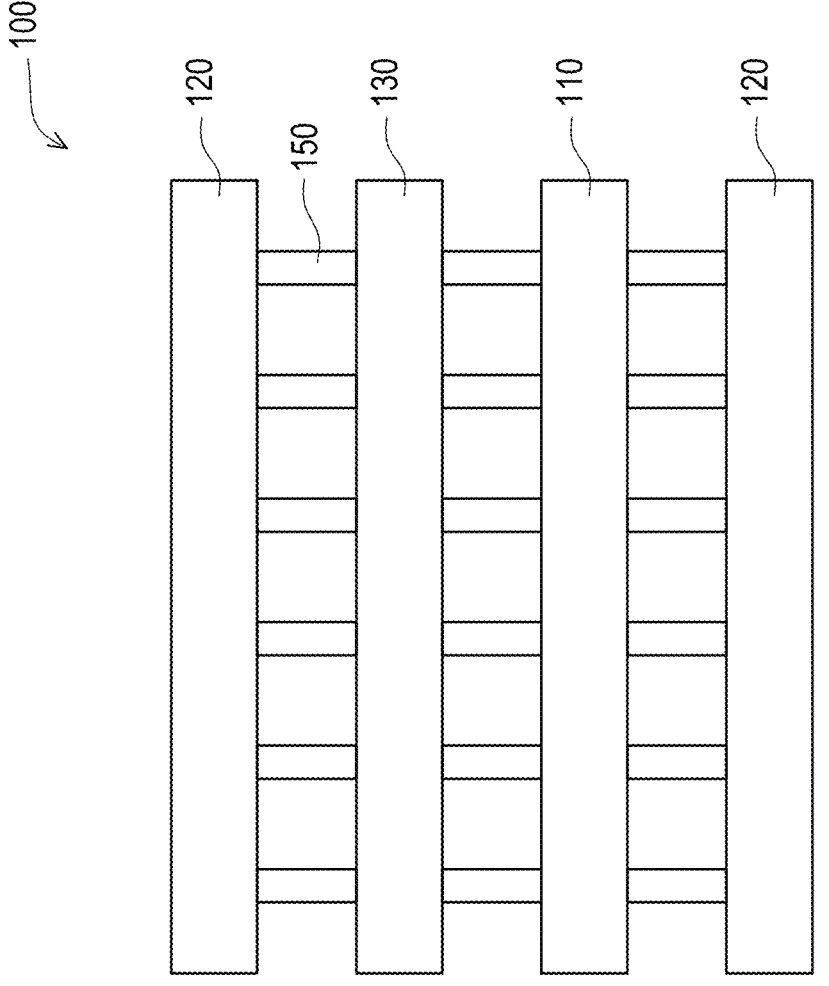
FIG. 3 is a schematic side view of a circuit board according to an embodiment of the disclosure.

Referring to FIGS. 1, 2A, and 3, in this embodiment, the circuit board surface 100a has a package region P, and the package region P corresponds to a position where the electronic package 200 is disposed. The package region P is rectangular and has four sides S1, S2, S3, and S4. The circuit board 100 includes a power layer 110. As shown in FIG. 3, the power layer 110 is a patterned conductive layer of one layer of the circuit board 100. The power layer 110 includes a first power plane 111, a second power plane 112, a third power plane 113, and a fourth power plane 114. An orthographic projection of the first power plane 111 on the circuit board surface 100a extends from an outside of the package region P into the package region P and extends through at least one of these sides S (e.g., the side S1). An orthographic projection of the second power plane 112 on the circuit board surface 100a extends from the outside of the package region P into the package region P and extends through at least three of these sides S (e.g., the sides S2, S3, and S4). An orthographic projection of the third power plane 113 on the circuit board surface 100a extends from the outside of the package region P into the package region P and extends through at least one of these sides S (e.g., the side S1). An orthographic projection of the fourth power plane 114 on the circuit board surface 100a extends from the outside of the package region P into the package region P and extends through at least one of these sides S (e.g., the side S1). In addition, an area of the orthographic projection of the second power plane 112 on the circuit board surface 100a in the package region P is greater than an area of the orthographic projection of each of the first power plane 111, the third power plane 113, and the fourth power plane 114 on the circuit board surface 100a in the package region P. Also, an area of the orthographic projection of the second power plane 112 on the circuit board surface 100a in the package region P is greater than the sum areas of the orthographic projection of the first power plane 111, the third power plane 113, and the fourth power plane 114 on the circuit board surface 100a in the package region P. At least one of these sides S (e.g., the side S1) through which the orthographic projection of the first power plane 111 on the circuit board surface 100a extends is the same as one of these sides S (e.g., the side S1) through which the orthographic projection of the third power plane 113 on the circuit board surface 100a extends, and at least one of these sides S (e.g., the side S1) through which the orthographic projection of the first power plane 111 on the circuit board surface 100a extends is the same as one of these sides S (e.g., the side S1) through which the orthographic projection of the fourth power plane 114 on the circuit board surface 100a extends.

In this embodiment, one of at least three of these sides S (e.g., the side S2) through which the orthographic projection of the second power plane 112 on the circuit board surface 100a extends may the same as at least one of these sides S (e.g., the side S2) through which the orthographic projection of the first power plane 111 on the circuit board surface 100a extends. That is to say, at least one of these sides S (e.g., the side S2) through which the orthographic projection of the first power plane 111 on the circuit board surface 100a extends may be the same as at least one of these sides S (e.g., the side S2) through which the orthographic projection of the second power plane 112 on the circuit board surface 100a extends. In other embodiments, at least three of these sides S (e.g., the sides S2, S3, and S4) through which the orthographic projection of the second power plane 112 on the circuit board surface 100a extends may also be different from at least one of these sides S (e.g., the side S1) through which the orthographic projection of the first power plane 111 on the circuit board surface 100a extends, depending on the needs. In addition, these sides S (e.g., the sides S2, S3, and S4) through which the orthographic projection of the second power plane 112 on the circuit board surface 100a extends are different from one of these sides S (e.g., the side S1) through which the orthographic projection of the third power plane 113 or the fourth power plane 114 on the circuit board surface 100a extends.

In this embodiment, the area of the orthographic projection of the first power plane 111 on the circuit board surface 100a in the package region P is greater than that of the third power plane 113, and the area of the orthographic projection of the first power plane 111 on the circuit board surface 100a in the package region P is greater than the area of the orthographic projection of the fourth power plane 114 on the circuit board surface 100a in the package region P. In addition, the area of the orthographic projection of the third power plane 113 on the circuit board surface 100a in the package region P is greater than the area of the orthogonal projection of the fourth power plane 114 on the circuit board surface 100a in the package region P. Specifically, since the fourth power plane 114 is expected to provide the minimum current and power, the reserved area in the package area P for the orthographic projection of the fourth power plane 114 on the circuit board surface 100a may be the smallest.

In this embodiment, the second power plane 112 is expected to provide a current greater than the current of the first power plane 111, the third power plane 113, and the fourth power plane 114 respectively. In an embodiment, the current of the first power plane 111, the second power plane 112, the third power plane 113, and the fourth power plane 114 are, for example, 0.7 to 1.4 amps, 2.5 amps, 0.6 amps, and 0.2 amps respectively. Correspondingly, the power of the second power plane 112 may be greater than the power of the first power plane 111, the third power plane 113, and the fourth power plane 114 respectively. That is to say, in this embodiment, the second power plane 112 in the power layer 110 is expected to provide the maximum current and the maximum power. The second power plane 112 is, for example, a circuit block applied to a differential signal pair of USB3.0 or USB4.0, which requires a greater current. In addition, the first power plane 111 is expected to provide a current greater than the currents that the third power plane 113 and the fourth power plane 114 are expected to provide respectively, and the third power plane 113 is expected to provide a current greater than the current that the fourth power plane 114 is expected to provide. That is to say, fourth power plane 114 is expected to provide the minimum current. Specifically, since the second power plane 112 is expected to provide the maximum current and the maximum power, and the second power plane 112 has the maximum area and a maximum width, the issue of overheating of the circuit board 100 may be solved. It is noteworthy that the width described here is a sum of lengths of these sides S through which the orthographic projection of each of the power planes on the circuit board surface 100a extends. That is to say, the greater the current and the power which the power plane is expected to provide, the greater area of the power plane is required to be, so as to reduce the issue of overheating on the circuit board due to the large current and power. In short, a width of the sides through which the orthographic projection of the power plane extends is related to magnitude of the current the power plane is expected to provide.

In this embodiment, the orthographic projection of the second power plane 112 on the circuit board surface 100a may have a recess R in the package region P. The orthographic projection of the first power plane 111 on the circuit board surface 100a extends into the recess R in the package region P. That is to say, the orthographic projection of the first power plane 111 on the circuit board surface 100a extends to a center of the package region P in the package region P. In addition, the orthographic projection of the third power plane 113 on the circuit board surface 100a may extend into the recess R in the package region P and surround a region where the first power plane 111 extends into the recess R. Furthermore, the orthographic projection of the fourth power plane 114 on the circuit board surface 100a may also extend into the recess R in the package region P and surround a region where the third power plane 113 extends into the recess R. In addition, since the third power plane 113 is expected to provide a current greater than the fourth power plane 114 is expected to provide, a width of the side S1 through which the orthographic projection of the third power plane 113 on the circuit board surface 100a extends may be greater than the width of the side S1 through which the orthographic projection of the fourth power plane 114 on the circuit board surface 100a extends.

Referring to FIGS. 1, 2A, and 3, the circuit board 100 may further include multiple signal layers 120 and a ground layer 130, which are respectively formed by the patterned conductive layers of the circuit board 100. A top layer of the circuit board 100 further includes multiple pad regions 140a, as shown in FIG. 2A. The pad regions 140a are, for example, formed by at least one of the pads 140 on the top layer of the circuit board 100 as shown in FIG. 1. In an embodiment, the pads 140 shown in FIG. 1 are disposed on the signal layer 120 closest to the electronic package 200, as shown in FIGS. 1 and 3. In addition, the adjacent pads 140 respectively form multiple high-speed contact pairs. Specifically, a size of each of the pad regions 140a corresponds to the number of pads 140. When the size of the pad region 140a is greater, it means that the number of pads 140 included therein is greater. The positions of the pad regions 140a correspond to conductive through holes 150. In this embodiment, the first power plane 111 is mainly used in a logic circuit block. Therefore, the greater pad regions 140a is connected through an area extending into the recess R, and corresponds to more conductive through holes 150.

The power layer 110 and the ground layer 130 are disposed between the signal layers 120. In this embodiment, the circuit board 100 has four layers (i.e., four patterned conductive layers), and each of the layers is electrically connected to each other by using the conductive through holes 150. The four layers include two signal layers 120, the power layer 110, and the ground layer 130. The two signal layers 120 are respectively disposed on the uppermost layer and the lowermost layer of the circuit board 100, and the power layer 110 and the ground layer 130 are disposed between the two signal layers 120.

Figure 4:
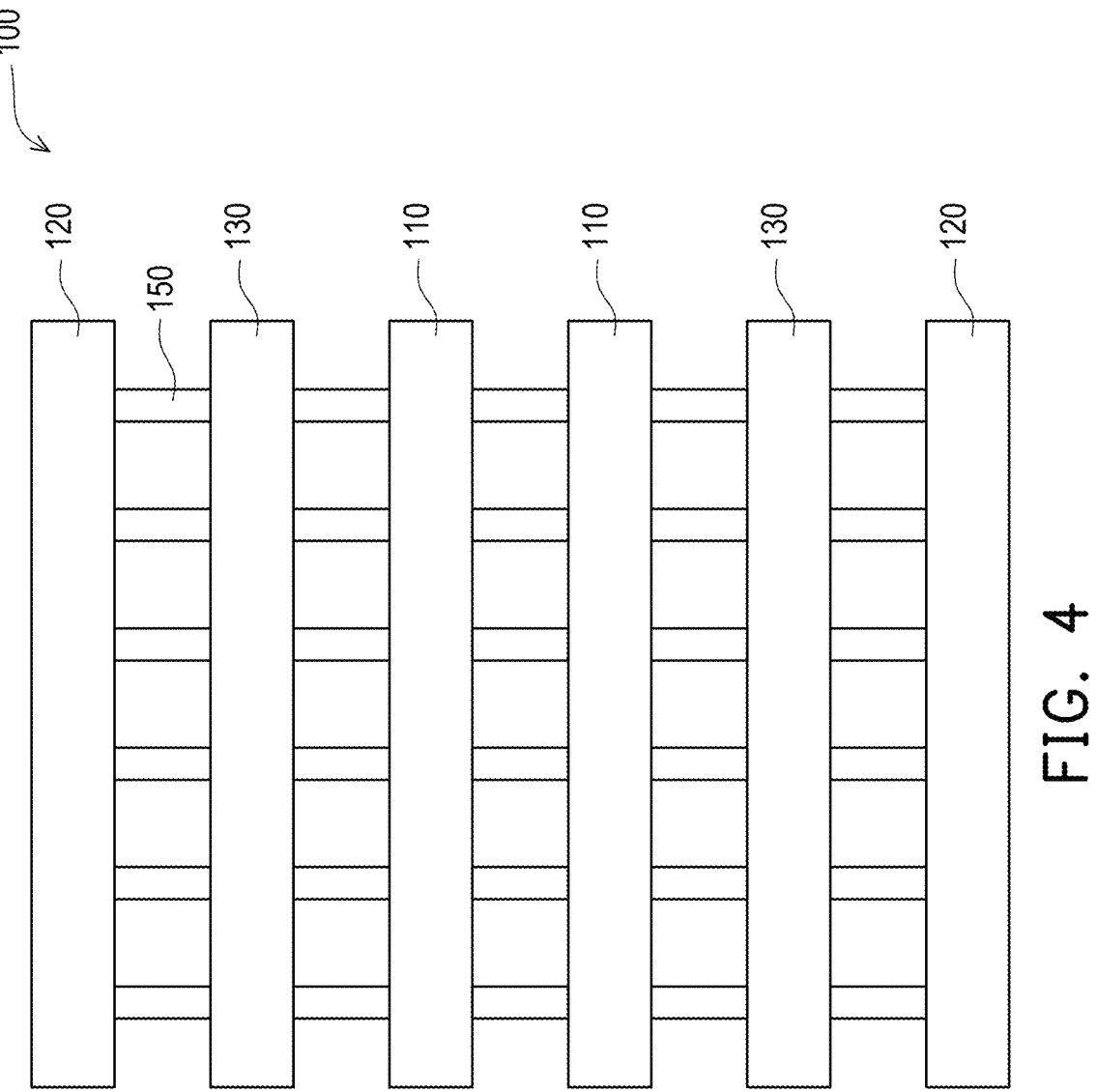
FIG. 4 is a schematic side view of a circuit board according to another embodiment of the disclosure.

Referring to FIGS. 2A and 4, in this embodiment, the circuit board 100 has six layers (i.e., six patterned conductive layers), and each of the layers is electrically connected to each other by using the conductive through holes 150. The six layers include two signal layers 120, two power layers 110, and two ground layers 130. The two signal layers 120 are respectively disposed on the uppermost layer and the lowermost layer of the circuit board 100. The two power layers 110 are disposed between the two ground layers 130, and the two power layers 110 may have the same pattern. Compared to the embodiment of FIG. 3, in the embodiment of FIG. 4, there are one additional power layer 110 and ground layer 130. In an embodiment, for the circuit board 100 with six patterned conductive layers, the two power layers 110 thereof may be provided with the same power plane.

Figure 2B:
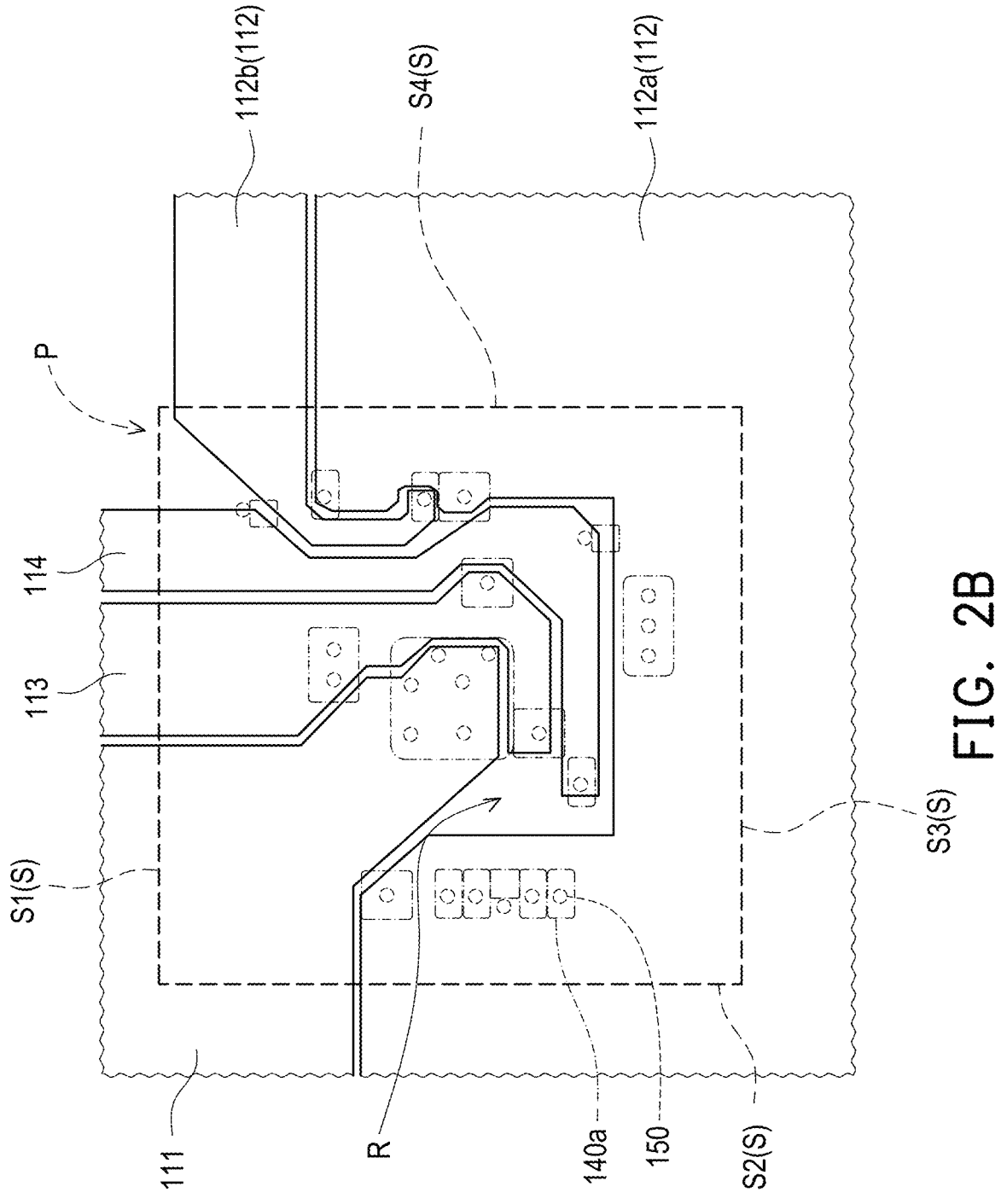
FIG. 2B is a schematic view of a package region of a circuit board according to another embodiment of the disclosure.

Referring to FIG. 2B, compared to the embodiment of FIG. 2A, in the embodiment of FIG. 2B, the second power plane 112 may further include a main power plane 112a and at least one first sub-power plane 112b. The voltages of the main power plane 112a and the first sub-power plane 112b are the same, and an orthographic projection of the main power plane 112a on the circuit board surface 100a and an orthographic projection of the first sub-power plane 112b on the circuit board surface 100a are not connected to each other in the package region P so that they are not directly electrically conductive to each other in this package region P. In addition, the side S (e.g., the side S4) which the orthographic projection of the first sub-power plane 112b on the circuit board surface 100a extending from the outside of the package region P into the package region P passing through is the same as one of at least three of the sides S (e.g., the side S4) which the orthographic projection of the main power plane 112a on the circuit board surface 100a extending from the outside of the package region P into the package region P passing through. Specifically, since the second power plane 112 is a main voltage source of the circuit board 100, many different circuit blocks are provided with the voltages by the second power plane 112, which easily causes noise between signals and reduces performance of a high-speed integrated circuit. Therefore, the second power plane 112 is divided into the main power plane 112a and the at least one first sub-power plane 112b, and the main power plane 112a and the first sub-power plane 112b are not connected to each other, which may separate different circuit blocks to reduce interference caused by the noise. In an embodiment, since compared to a transmitting signal (Tx), a receiving signal (Rx) is weaker and is susceptible to the external interference, the separate main power plane 112a is mainly used in a circuit block of the receiving signal (Rx) in the differential signal pair of USB 4.0.

Figure 2C:
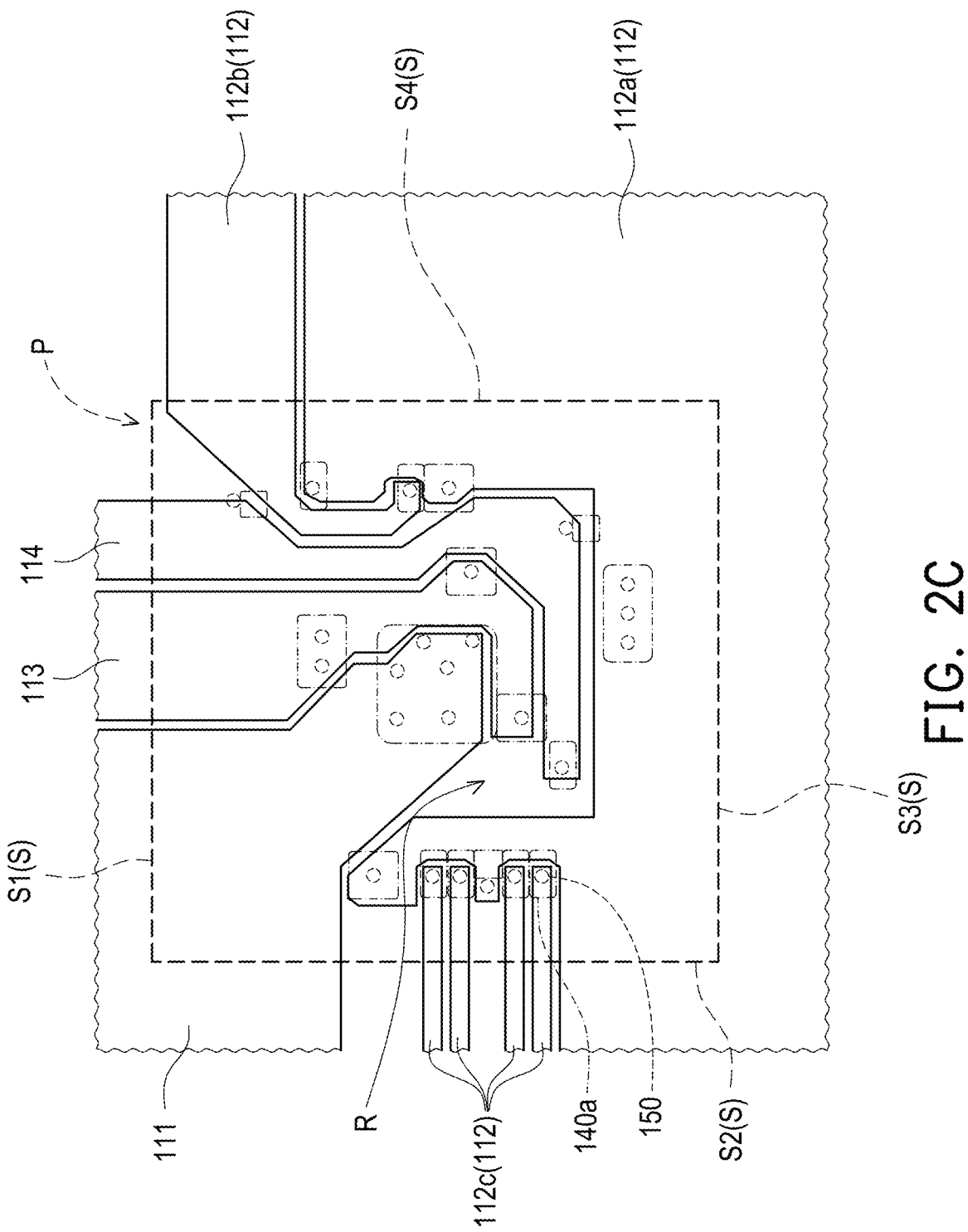
FIG. 2C is a schematic view of a package region of a circuit board according to another embodiment of the disclosure.

Referring to FIG. 2C, compared to the embodiment of FIG. 2B, in the embodiment of FIG. 2C, the second power plane 112 may further include multiple second sub-power planes 112c. Each of the second sub-power planes 112c is expected to provide the same voltage as the main power plane 112a, and the orthographic projection of the main power plane 112a on circuit board surface 100a and orthographic projections of the second sub-power planes 112c on the circuit board surface 100a are not connected to each other in the package region P, so that they are not directly electrically conductive to each other in this package region P. In addition, the side S (e.g., the side S2) which the orthographic projection of each of the second sub-power planes 112c on the circuit board surface 100a extending from the outside of the package region P into the package region P passing through is the same as one of at least three of the sides S (e.g., the side S2) which the orthographic projection of the main power plane 112a on the circuit board surface 100a extending from the outside of the package region P into the package region P passing through, but is different from the side S (e.g., the side S4) which the orthographic projection of the first sub-power plane 112b on the circuit board surface 100a extending from the outside of the package region P into the package region P passing through. Specifically, the second sub-power planes 112c are configured to connect to more different circuit blocks to reduce signal interference between each other. In an embodiment, since compared to the transmitting signal (Tx), the receiving signal (Rx) is weaker and is susceptible to the external interference, the separate second sub-power plane 112c is mainly used in the circuit block of the receiving signal (Rx) in the differential signal pair of USB 4.0.

Based on the above, in the above embodiment of the disclosure, four power planes are disposed on the power layer of the circuit board, which may provide different voltages to the device in the electronic package, and the second power plane is divided into multiple sub-power planes to be connected to different devices, which may reduce crosstalk between signals. In addition, the design of the power planes in the disclosure may reduce the resistance of the circuit board to reduce the issue of overheating of the circuit board.

What is claimed is:

1. A circuit board, suitable for mounting an electronic package, wherein the circuit board has a circuit board surface, the circuit board surface has a package region corresponding to the electronic package, the package region is rectangular and has four sides, and the circuit board comprises:

a power layer comprising a first power plane, a second power plane, a third power plane, and a fourth power plane, wherein an orthographic projection of the first power plane on the circuit board surface extends from an outside of the package region into the package region and extends through at least one of the sides, an orthographic projection of the second power plane on the circuit board surface extends from the outside of the package region into the package region and extends through at least three of the sides, an orthographic projection of the third power plane on the circuit board surface extends from the outside of the package region into the package region and extends through at least one of the sides, an orthographic projection of the fourth power plane on the circuit board surface extends from the outside of the package region into the package region and extends through at least one of the sides, an area of the orthographic projection of the second power plane on the circuit board surface in the package region is greater than an area of the orthographic projections of each of the first power plane, the third power plane, and the fourth power plane on the circuit board surface in the package region, and at least one of the sides through which the orthographic projection of the first power plane on the circuit board surface extends is the same as one of the sides through which the orthographic projection of the third power plane on the circuit board surface extends, and at least one of the sides through which the orthographic projection of the first power plane on the circuit board surface extends is the same as one of the sides through which the orthographic projection of the fourth power plane on the circuit board surface extends.

2. The circuit board according to claim 1, wherein one of at least three of the sides through which the orthographic projection of the second power plane on the circuit board surface extends is the same as at least one of the sides through which the orthographic projection of the first power plane on the circuit board surface extends.

3. The circuit board according to claim 1, wherein the sides through which the orthographic projection of the second power plane on the circuit board surface extends is different from one of the sides through which the orthographic projection of the third power plane or the fourth power plane on the circuit board surface extends.

4. The circuit board according to claim 1, wherein a current of the second power plane is greater than a current each of the first power plane, the third power plane, and the fourth power plane.

5. The circuit board according to claim 1, wherein a width of one of the sides through which the orthographic projection of the third power plane on the circuit board surface extends is greater than a width of one of the sides through which the orthographic projection of the fourth power plane on the circuit board surface extends.

6. The circuit board according to claim 1, wherein the second power plane further comprises:

a main power plane; and at least one first sub-power plane, wherein a voltage of the main power plane is the same as a voltage of the at least one first sub-power plane, and an orthographic projection of the main power plane on the circuit board surface and an orthographic projection of the at least one first sub-power plane on the circuit board surface are not connected to each other in the package region.

7. The circuit board according to claim 6, wherein the second power plane further comprises:

a plurality of second sub-power plane, wherein a voltage of the second sub-power plane is the same as the voltage of the main power plane, and an orthographic projection of the second sub-power plane on the circuit board surface, the orthographic projection of the main power plane on the circuit board surface, and the orthographic projection of the at least one first sub-power plane on the circuit board surface are not connected to each other in the package region.

8. The circuit board according to claim 1, wherein the orthographic projection of the second power plane on the circuit board surface has a recess in the package region, and the orthographic projection of the first power plane on the circuit board surface extends into the recess in the package region.

9. The circuit board according to claim 8, wherein the orthographic projection of the third power plane on the circuit board surface extends into the recess in the package region and surrounds a region where the orthographic projection of the first power plane on the circuit board surface extends into the recess.

10. The circuit board according to claim 9, wherein the orthographic projection of the fourth power plane on the circuit board surface extends into the recess in the package region and surrounds a region where the orthographic projection of the third power plane on the circuit board surface extends into the recess.

11. The circuit board according to claim 1, further comprising:
   a plurality of signal layers; and
   a ground layer, wherein the power layer and the ground layer are disposed between the signal layers.

12. The circuit board according to claim 11, wherein the circuit board further comprises:
   another power layer, wherein the power layers are disposed between the signal layers, and the power layers have a same pattern in the package region.

13. The circuit board according to claim 11, further comprising:
   a plurality of pads disposed on the signal layers, wherein the adjacent pads respectively form a plurality of high-speed contact pairs.

14. An electronic assembly, comprising:
   an electronic package;
   a circuit board electrically connected to the electronic package, wherein the circuit board has a circuit board surface, the circuit board surface has a package region corresponding to the electronic package, the package region is rectangular and has four sides, and the circuit board comprises:
      a power layer comprising a first power plane, a second power plane, a third power plane, and a fourth power plane, wherein an orthographic projection of the first power plane on the circuit board surface extends from an outside of the package region into the package region and extends through at least one of the sides,
      an orthographic projection of the second power plane on the circuit board surface extends from the outside of the package region into the package region and extends through at least three of the sides,
      an orthographic projection of the third power plane on the circuit board surface extends from the outside of the package region into the package region and extends through at least one of the sides,
      an orthographic projection of the fourth power plane on the circuit board surface extends from the outside of the package region into the package region and extends through at least one of the sides,
      an area of the orthographic projection of the second power plane on the circuit board surface in the package region is greater than an area of the orthographic projections of each of the first power plane, the third power plane, and the fourth power plane on the circuit board surface in the package region, and
      at least one of the sides through which the orthographic projection of the first power plane on the circuit board surface extends is the same as one of the sides through which the orthographic projection of the third power plane on the circuit board surface extends, and at least one of the sides through which the orthographic projection of the first power plane on the circuit board surface extends is the same as one of the sides through which the orthographic projection of the fourth power plane on the circuit board surface extends.

15. The electronic assembly according to claim 14, wherein one of at least three of the sides through which the orthographic projection of the second power plane on the circuit board surface extends is the same as at least one of the sides through which the orthographic projection of the first power plane on the circuit board surface extends.

16. The electronic assembly according to claim 14, wherein the sides through which the orthographic projection of the second power plane on the circuit board surface extends is different from one of the sides through which the orthographic projection of the third power plane or the fourth power plane on the circuit board surface extends.

17. The electronic assembly according to claim 14, wherein a current of the second power plane is greater than a current each of the first power plane, the third power plane, and the fourth power plane.

18. The electronic assembly according to claim 14, wherein a width of one of the sides through which the orthographic projection of the third power plane on the circuit board surface extends is greater than a width of one of the sides through which the orthographic projection of the fourth power plane on the circuit board surface extends.

19. The electronic assembly according to claim 14, wherein the second power plane further comprises:
   a main power plane; and
   at least one first sub-power plane, wherein a voltage of the main power plane is the same as a voltage of the at least one first sub-power plane, and an orthographic projection of the main power plane on the circuit board surface and an orthographic projection of the at least one first sub-power plane on the circuit board surface are not connected to each other in the package region.

20. The electronic assembly according to claim 19, wherein the second power plane further comprises:
   a plurality of second sub-power plane, wherein a voltage of the second sub-power plane is the same as the voltage of the main power plane, and an orthographic projection of the second sub-power plane on the circuit board surface, the orthographic projection of the main power plane on the circuit board surface, and the orthographic projection of the at least one first sub-power plane on the circuit board surface are not connected to each other in the package region.

21. The electronic assembly according to claim 14, wherein the orthographic projection of the second power plane on the circuit board surface has a recess in the package region, and the orthographic projection of the first power plane on the circuit board surface extends into the recess in the package region.

22. The electronic assembly according to claim 21, wherein the orthographic projection of the third power plane on the circuit board surface extends into the recess in the package region and surrounds a region where the orthographic projection of the first power plane on the circuit board surface extends into the recess.

23. The electronic assembly according to claim 22, wherein the orthographic projection of the fourth power plane on the circuit board surface extends into the recess in the package region and surrounds a region where the orthographic projection of the third power plane on the circuit board surface extends into the recess.

24. The electronic assembly according to claim 14, wherein the circuit board further comprises:
   a plurality of signal layers; and
   a ground layer, wherein the power layer and the ground layer are disposed between the signal layers.

25. The electronic assembly according to claim 24, wherein the circuit board further comprises:
   another power layer, wherein the power layers are disposed between the signal layers, and the power layers have a same pattern in the package region.

26. The electronic assembly according to claim 24, further comprising:

a plurality of pads disposed on the signal layers, wherein the adjacent pads respectively form a plurality of high-speed contact pairs.

27. The electronic assembly according to claim 14, further comprising:

a plurality of conductive balls connected to the circuit board and the electronic package.

* * * * *